US009419602B2

(12) United States Patent
Tousignant et al.

(10) Patent No.: US 9,419,602 B2
(45) Date of Patent: Aug. 16, 2016

(54) PASSIVE DRIVE CONTROL CIRCUIT FOR AC CURRENT

(71) Applicant: Honeywell International Inc., Morristown, NJ (US)

(72) Inventors: Daniel Tousignant, St-Jean-sur-Richelieu (CA); Daniel Landry, St-Hyacinthe (CA)

(73) Assignee: Honeywell International Inc., Morris Plains, NJ (US)

( * ) Notice: Subject to any disclaimer, the term of this patent is extended or adjusted under 35 U.S.C. 154(b) by 121 days.

(21) Appl. No.: 14/309,431

(22) Filed: Jun. 19, 2014

(65) Prior Publication Data

US 2015/0372673 A1 Dec. 24, 2015

(51) Int. Cl.
| H03K 17/687 | (2006.01) |
| H03K 17/13 | (2006.01) |
| H03K 17/16 | (2006.01) |
| H03K 17/567 | (2006.01) |

(52) U.S. Cl.
CPC ............. *H03K 17/136* (2013.01); *H03K 17/16* (2013.01); *H03K 17/567* (2013.01); *H03K 17/687* (2013.01); *H03K 17/6872* (2013.01); *H03K 17/6874* (2013.01); *H03K 2217/0009* (2013.01)

(58) Field of Classification Search
None
See application file for complete search history.

(56) References Cited

U.S. PATENT DOCUMENTS

| 3,899,713 | A | * | 8/1975 | Barkan | ............... F21V 23/0442 307/652 |
| 4,745,311 | A | * | 5/1988 | Iwasaki | ............ H03K 17/08124 327/428 |
| 4,829,779 | A | | 5/1989 | Munson et al. | |
| 4,939,995 | A | * | 7/1990 | Feinberg | ................ F42C 13/04 102/213 |
| 4,969,508 | A | | 11/1990 | Tate et al. | |
| 5,118,963 | A | * | 6/1992 | Gesin | ..................... H03K 17/79 307/113 |
| 5,294,849 | A | * | 3/1994 | Potter | .................... H05B 39/08 327/447 |
| 5,361,009 | A | * | 11/1994 | Lu | ......................... H03K 17/732 327/470 |
| 5,439,441 | A | | 8/1995 | Grimsley et al. | |
| 5,736,795 | A | | 4/1998 | Zuehlke et al. | |
| 5,801,940 | A | | 9/1998 | Russ et al. | |
| 5,903,139 | A | | 5/1999 | Kompelien | |
| 6,018,700 | A | * | 1/2000 | Edel | ................... G01R 19/2513 361/18 |
| 6,205,041 | B1 | | 3/2001 | Baker | |
| 6,288,458 | B1 | | 9/2001 | Berndt | |
| 6,490,174 | B1 | | 12/2002 | Kompelien | |

(Continued)

OTHER PUBLICATIONS

Cirrus Logic, Inc., "CS1501 Digital Power Factor Correction Control IC," 16 pages, 2012.

(Continued)

*Primary Examiner* — Tuan T Lam
(74) *Attorney, Agent, or Firm* — Seager, Tufte & Wickhem, LLP

(57) ABSTRACT

A circuit that may control current to a load without generating a large amount of electromagnetic interference on main lines of an AC power supply for the load and circuit. Control may be effected with silicon controlled rectifiers (SCRs). For instance, the circuit may implement passive triggering using a capacitor between the anode and the gate of an SCR. By using a sufficiently large capacitor, gate current may be applied during a zero crossing of a waveform of the AC power supply in a passive manner without a need to store energy prior to the zero crossing. The circuit may synchronize SCR triggering with a voltage variation in a clean manner, that is, without generating electromagnetic interference. The circuit may be used with an in-line thermostat. However, the circuit may be used in other ways.

20 Claims, 6 Drawing Sheets

(56) References Cited

U.S. PATENT DOCUMENTS

| | | |
|---|---|---|
| 6,619,055 B1 | 9/2003 | Addy |
| 6,622,925 B2 | 9/2003 | Carner et al. |
| 6,635,054 B2 | 10/2003 | Fjeld et al. |
| 6,702,811 B2 | 3/2004 | Stewart et al. |
| 6,771,996 B2 | 8/2004 | Bowe et al. |
| 6,808,524 B2 | 10/2004 | Lopath et al. |
| 6,893,438 B2 | 5/2005 | Hall et al. |
| 7,133,748 B2 | 11/2006 | Robinson |
| 7,476,988 B2 | 1/2009 | Mulhouse et al. |
| 7,574,283 B2 | 8/2009 | Wang et al. |
| 7,595,613 B2 | 9/2009 | Thompson et al. |
| 7,600,694 B2 | 10/2009 | Helt et al. |
| 7,642,674 B2 | 1/2010 | Mulhouse et al. |
| 7,692,559 B2 | 4/2010 | Face et al. |
| 7,837,676 B2 | 11/2010 | Sinelnikov et al. |
| 7,838,803 B1 | 11/2010 | Rosen |
| 7,859,815 B2 | 12/2010 | Black et al. |
| 7,992,794 B2 | 8/2011 | Leen et al. |
| 8,216,216 B2 | 7/2012 | Warnking et al. |
| 8,768,341 B2 * | 7/2014 | Coutelou ............... G01D 21/00 340/501 |
| 2002/0181251 A1 | 12/2002 | Kompelien |
| 2003/0040279 A1 | 2/2003 | Ballweg |
| 2003/0060821 A1 | 3/2003 | Hall et al. |
| 2003/0073891 A1 | 4/2003 | Chen et al. |
| 2006/0112700 A1 | 6/2006 | Choi et al. |
| 2007/0114848 A1 | 5/2007 | Mulhouse et al. |
| 2007/0115135 A1 | 5/2007 | Mulhouse et al. |
| 2007/0119961 A1 | 5/2007 | Kaiser |
| 2007/0163844 A1 | 7/2007 | Jahkonen |
| 2007/0241203 A1 | 10/2007 | Wagner et al. |
| 2007/0290924 A1 | 12/2007 | McCoy |
| 2007/0296260 A1 | 12/2007 | Stossel |
| 2009/0154206 A1 | 6/2009 | Fouquet et al. |
| 2009/0167265 A1 | 7/2009 | Vanderzon |
| 2009/0206657 A1 | 8/2009 | Vuk et al. |
| 2010/0026379 A1 | 2/2010 | Simard et al. |
| 2010/0225267 A1 | 9/2010 | Elhalis |
| 2010/0314458 A1 | 12/2010 | Votaw et al. |
| 2012/0235490 A1 | 9/2012 | Lee et al. |
| 2013/0213952 A1 | 8/2013 | Boutin et al. |
| 2014/0312131 A1 | 10/2014 | Tousignant et al. |
| 2014/0312696 A1 | 10/2014 | Tousignant et al. |
| 2014/0312697 A1 | 10/2014 | Landry et al. |
| 2015/0001929 A1 | 1/2015 | Juntunen et al. |
| 2015/0001930 A1 | 1/2015 | Juntunen et al. |
| 2015/0002165 A1 | 1/2015 | Juntunen et al. |

OTHER PUBLICATIONS

International Search Report for Corresponding Application No. PCT/US2014/044229, dated Oct. 13, 2014.
U.S. Appl. No. 14/300,232, filed Jun. 9, 2014.
U.S. Appl. No. 14/309,553, filed Jun. 19, 2014.
U.S. Appl. No. 14/329,357, filed Jul. 11, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.
Signetics Linear Products, "TDA1024 Zero Crossing Triac Trigger," Product Specification, 14 pages, Sep. 1985.

* cited by examiner

PASSIVE DRIVE CONTROL CIRCUIT FOR AC CURRENT

BACKGROUND

The present disclosure pertains to electrical circuits and particularly to electricity control circuits.

SUMMARY

The disclosure reveals a circuit that may control current to a load without generating a large amount of electromagnetic interference on main lines of an AC power supply for the load and circuit. Control may be effected with silicon controlled rectifiers (SCRs). For instance, the circuit may implement passive triggering using a capacitor between the anode and the gate of an SCR. By using a sufficiently large capacitor, gate current may be applied during a zero crossing of a waveform of the AC power supply in a passive manner without a need to store energy prior to the zero crossing. The circuit may synchronize SCR triggering with a voltage variation in a clean manner, that is, without generating electromagnetic interference. The circuit may be used with an in-line thermostat. However, the circuit may be used in other ways.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

In an in-line application like a controller in series with a load, electromagnetic conducted emissions (EMI) limits need to be respected (for example, in the U.S.A., see FCC regulations). In order to comply with FCC regulations relative to using SCRs as a switching device in the controller, the triggering approach may have to be controlled in such a way that low EMI noise is emitted on the AC main lines. Usual related art recommended triggering approaches do not necessarily comply with the regulations. Active triggering may be used; however, with each SCR having a different reference for its gate, the circuit can become very complex.

The present approach may solve a reference issue of active triggering by doing passive triggering using a capacitor between the anode and the gate of the SCR. Passive triggering may use power from a commercial power supply line. Other approaches may use resistive techniques between the anode and gate to trigger the SCR. These approaches cannot necessarily apply current through the gate at the zero crossing because a voltage drop may be needed in order to generate the current. Such triggering approaches generate non-compliant electromagnetic conducted emission.

The current through a capacitor may depend on its size and its variation of voltage which is a maximum at zero crossing of the power supply waveform. So, by using a sufficiently large capacitor, the gate current may be applied at the zero crossing in a passive manner without a need to store the energy prior to a zero crossing.

The present driving approach or circuit may be used in any application with voltage variation like an AC supply. It may synchronize the SCR triggering with the voltage variation in a clean manner, i.e., without generating electromagnetic interference.

Specifically, the circuit may be used with an in-line thermostat when the controller's switch is made with SCRs. However, the circuit is not necessarily limited to this application; it can be used in virtually any kind of controller using SCRs on an AC supply. An addition of a power steal module can be useful compliment to the present circuit but it is not necessarily needed for the present SCR circuit.

Figure 1:
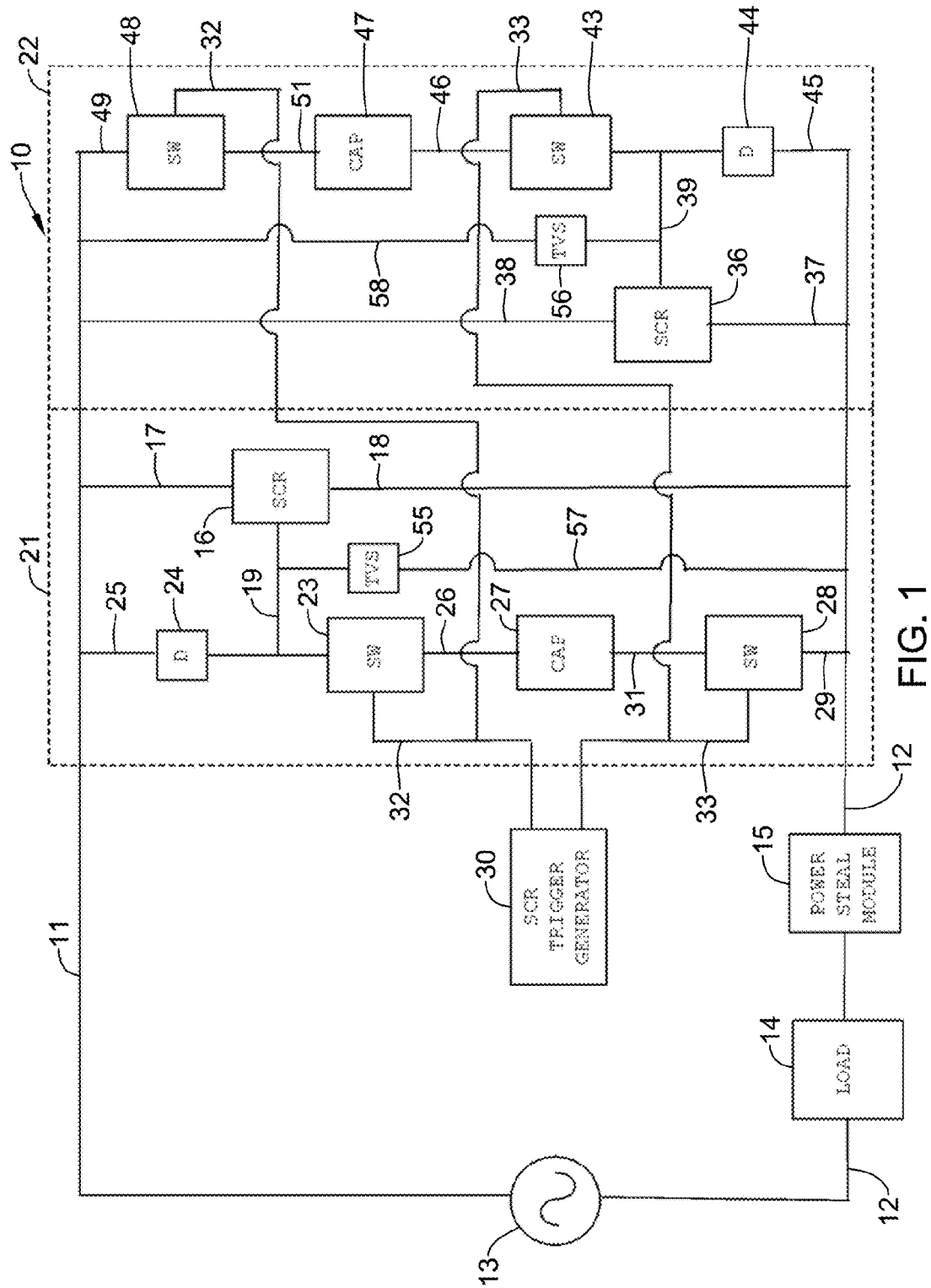
FIG. 1 is a block diagram of an SRC passive drive circuit.

FIG. 1 is a block diagram of an SRC passive drive circuit 10. A line (1) 11 may connect one side circuit 10 to an AC power source 13. A line (2) 12 may connect power source 13 to a load 14 which may be an electric heater. Load 14 may be connected to a power steal module 15 which in turn can be connected to circuit 10. Module 15 may be absent in view of a description of circuit 10. Line 12 may be connected to the other side of circuit 10.

A first portion 21 of circuit 10 may be noted. Portion 21 may cover a half-wave operation. A second portion 22 may cover the other half-wave operation of circuit 10 as desired. An SCR 16 may have a first terminal at line 17 connected to line 11, and a second terminal at line 18 connected to line 12. A control terminal of SCR 16 may be connected by a line 19 to a first terminal of a first switch 23 and a first terminal of a diode 24. A second terminal of diode 24 may be connected by a line 25 to line 11.

Switch 23 may have a second terminal connected by a line 26 to a first end of a capacitor 27. A second switch 28 may have a first terminal connected by a line 29 to line 12. A second end of capacitor 27 may be connected by a line 31 to a second terminal of switch 28.

A control terminal of switch 23 may be connected by a line 32 to a first output of a trigger signal generator 30. A control terminal of switch 28 may be connected by a line 33 to a second output of trigger signal generator 30. Signals from generator 30 may turn switches 23 and 28 on and off according to signals provided to control terminals from lines 32 and 33, respectively.

Second portion 22 of circuit 10 may be noted. A second SCR 36 may have a first terminal at a line 37 connected to line 12, and a second terminal at a line 38 connected to line 11. A control terminal of SCR 36 may be connected by a line 39 to a first terminal of a third switch 43 and a first terminal of a diode 44. A second terminal of diode 44 may be connected by a line 45 to line 12.

Switch 43 may have a second terminal connected by a line 46 to a first end of a capacitor 47. A fourth switch 48 may have a first terminal connected by a line 49 to line 11. A second end of capacitor 47 may be connected by a line 51 to a second terminal of switch 48.

A control terminal of switch 43 may be connected by line 33 to the second output of trigger signal generator 30. A control terminal of switch 48 may be connected by a line 32 to a first output of trigger signal generator 30. Signals from generator 30 may turn switches 43 and 48 on and off according to signals provided to control terminals from lines 33 and 32, respectively.

First portion 21 of circuit 10 may incorporate a transient-voltage suppression device 55 having a first end connected to line 19 and a second end connected by line 57 to line 12. Second portion 22 of circuit 10 may incorporate a transient-voltage suppression device 56 having a first end connected to line 39 and a second end connected by line 58 to line 11.

Figure 2:
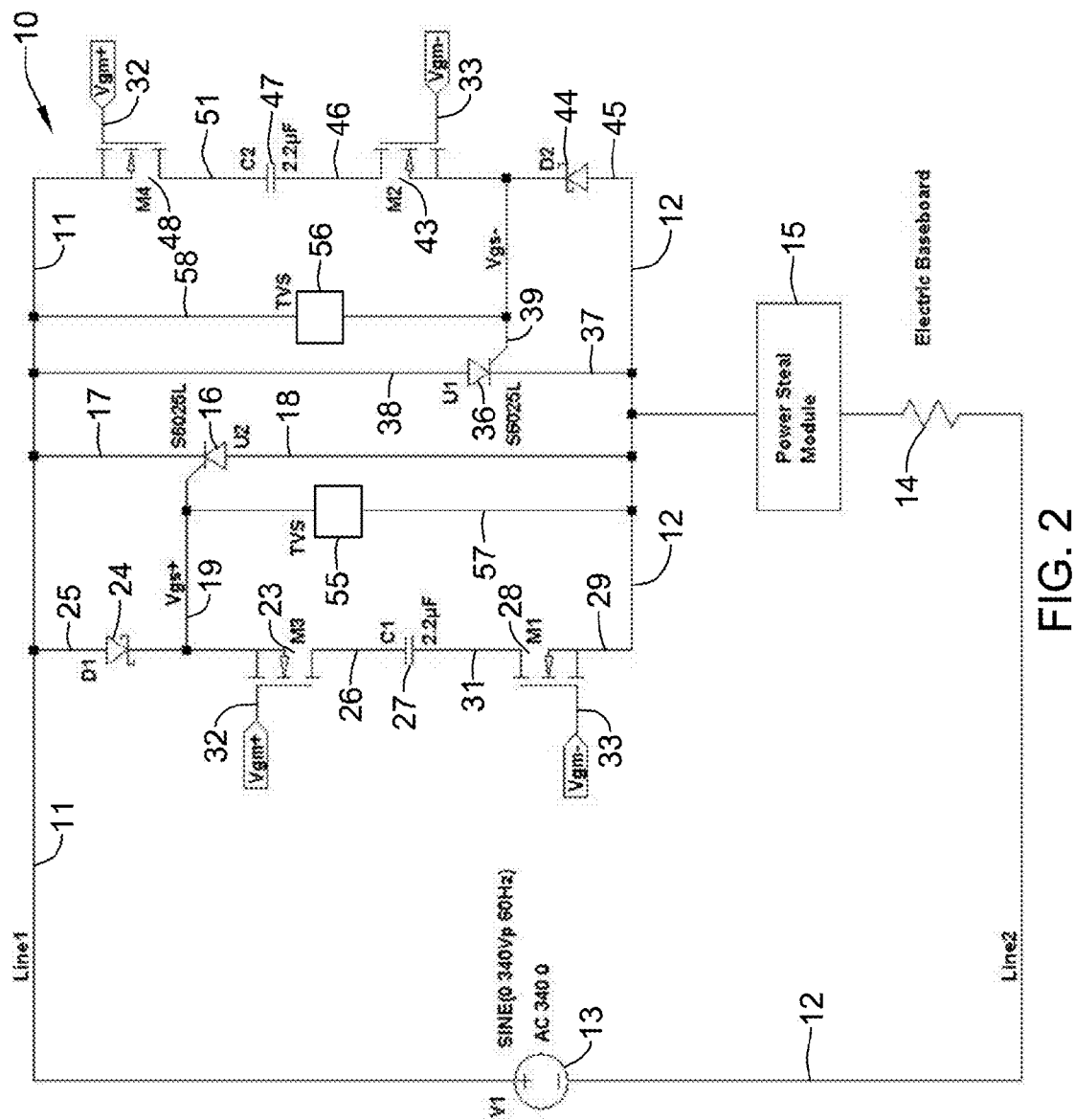
FIG. 2 is a diagram of the passive drive circuit but with more detail than the diagram of FIG. 1.

FIG. 2 is a diagram of the passive drive circuit 10 but with more detail than the diagram of FIG. 1. The switches 23, 28, 43 and 48 may be N-channel FETs. The capacitors 27 and 47 may be 2.2 microfarads. Diodes 24 and 44 may be Schottky diodes.

The MOSFETs 23, 28, 43 and 48 may be just switches able to use low voltage capacitors 27 and 47. MOSFETs 23 and 43 could be sufficient to keep the circuit deactivated but capacitors 27 and 47 may need to be high voltage capacitors because of the parasite diode of MOSFETs 23, 28, 43 and 48. So, the Vgm signals on lines 32 and 33 may be either high or low with respect to their source pin, to activate or not activate these switches.

Figure 3:
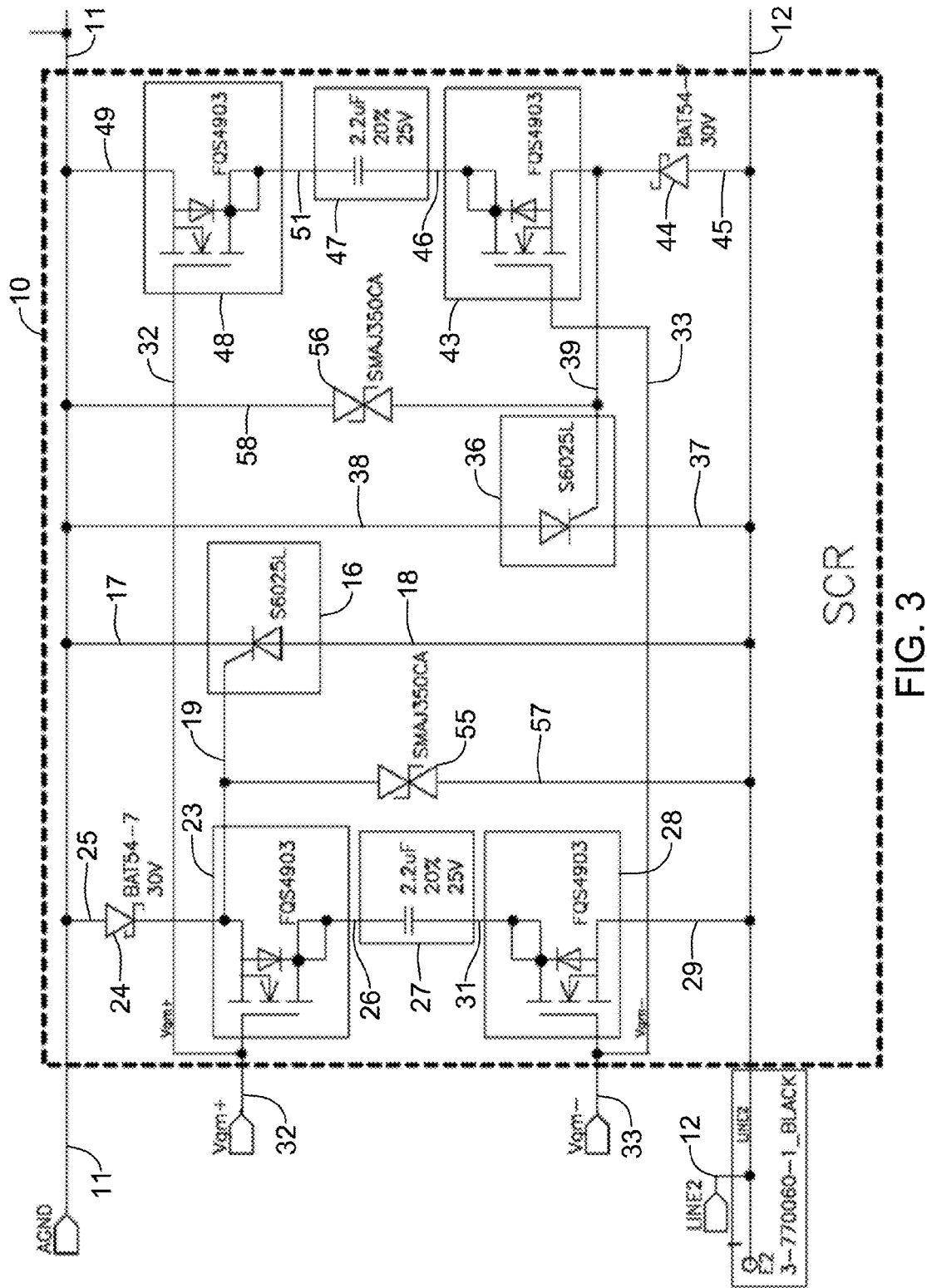
FIG. 3 is a diagram of the circuit like that of FIG. 2 but with examples of component devices.

FIG. 3 is a diagram of circuit 10 like that of FIG. 2 but with examples of component devices. Examples of components for switches 23, 28, 43 and 48 may be of model FQS4903. Examples of SCRs 16 and 36 may be of model S6025L. Examples of the 2.2 microfarad capacitors 27 and 47 may be rated at 25 volts and have a 20 percent tolerance. Examples of Schottky diodes 24 and 44 may be of model BAT54 (30 v). Examples of transient-voltage suppression devices (TVSs) 55 and 56 may be of model SMAJ350CA. The examples of the noted components may be substituted with those of other model designations.

Figure 4:
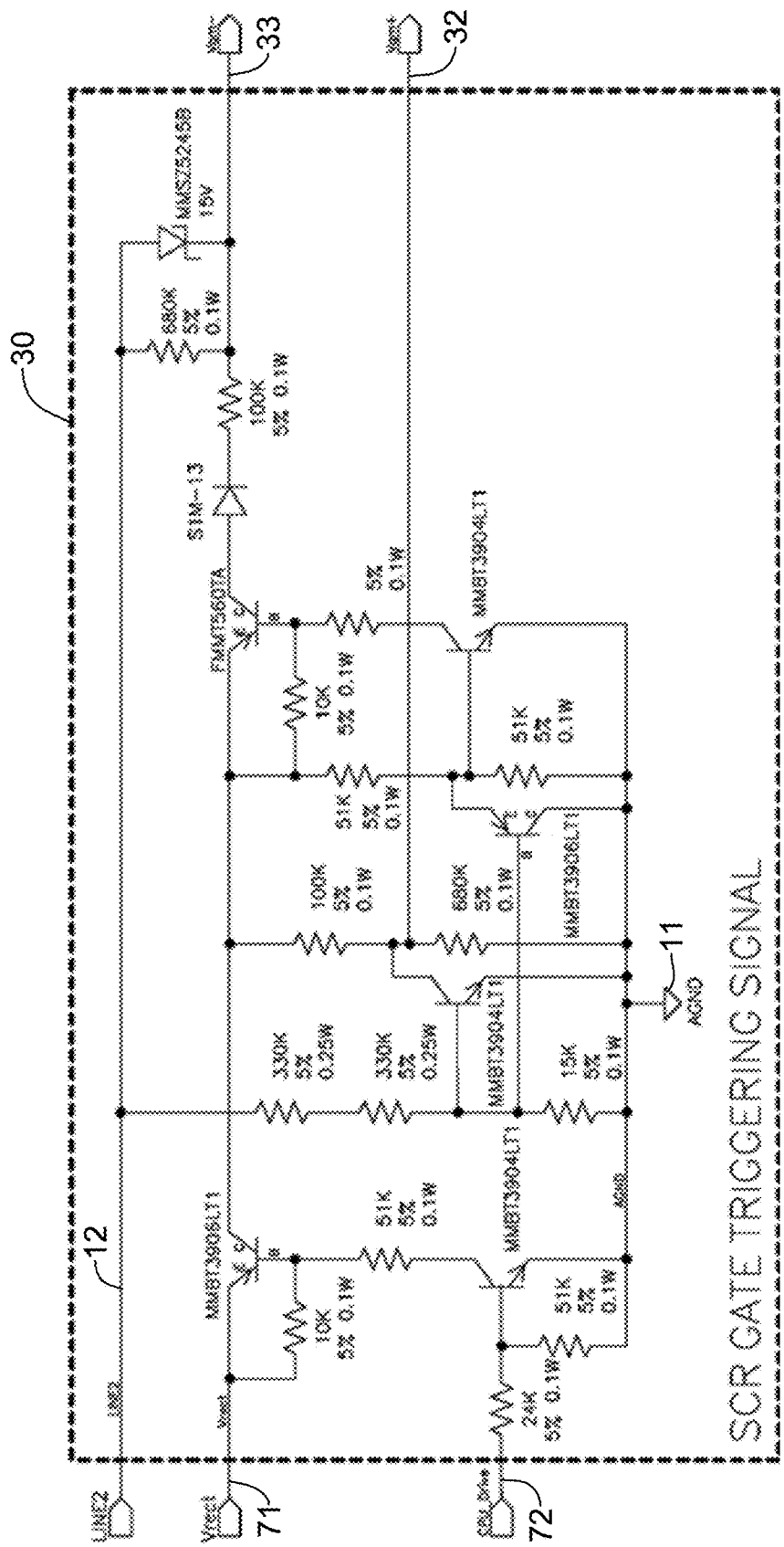
FIG. 4 is a diagram of an SCR gate triggering signal generator.

FIG. 4 is a diagram of an SCR gate triggering signal generator 30 designed to provide Vgm+ and Vgm− signals on lines 32 and 33, respectively. Vrect on line 71 may be a rectified signal of power source 13. A signal on line 72 may be that from a CPU drive. The circuit for generator 30 may be regarded as an illustrative example since other circuit designs may suffice for generating signals Vgm+ and Vgm− on lines 32 and 33.

Figure 5:
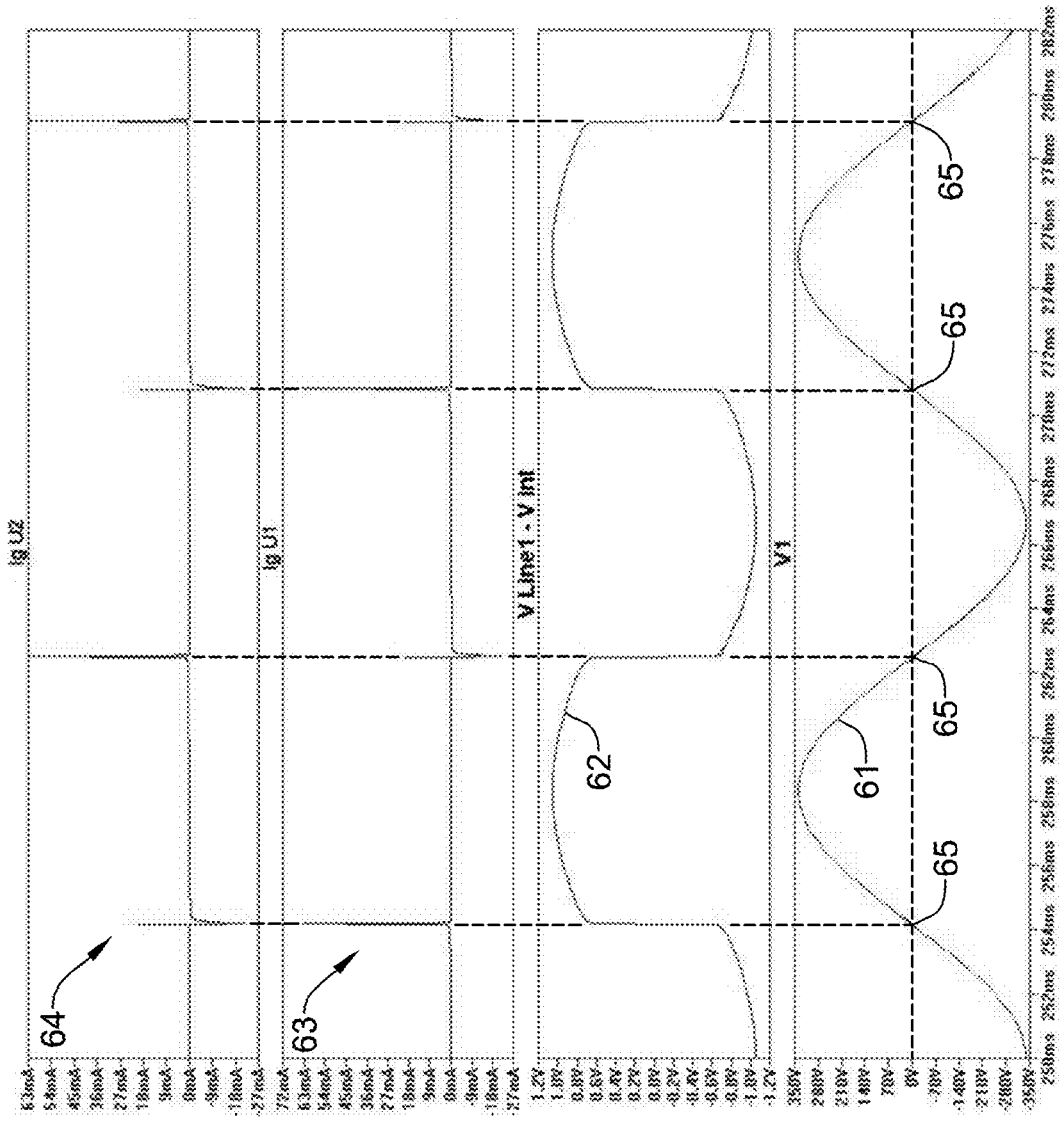
FIG. 5 is a diagram of waveforms indicating a basis of gate signals for SRCs of the circuit.

FIG. 5 is a diagram of a graph showing magnitude versus time for waveforms indicating a basis of gate signals for SRCs 16 and 36. Since nothing appears to happen in the OFF state, just the waveforms of the ON state are shown in the diagram. A V1 waveform shown by curve 61 may represent the AC power source 13. A V Line1-V int waveform 62 may appear at the node between circuit 10 and the power steal module 15. So, at each V1 zero crossing 65, a V Line1-V int waveform 62 may change polarity thus, since I=C dV/dt, the variation of voltage across the capacitors 27 and 47 may generate the necessary current to trigger the SCRs 16 and 36. Since SCRs conduct only in one direction, the positive variation of current Ig on line 39 as shown by waveform 63 may trigger SCR 36 and the negative variation of current Ig on line 19 as shown by waveform 64 may trigger SCR 16.

Figure 6:
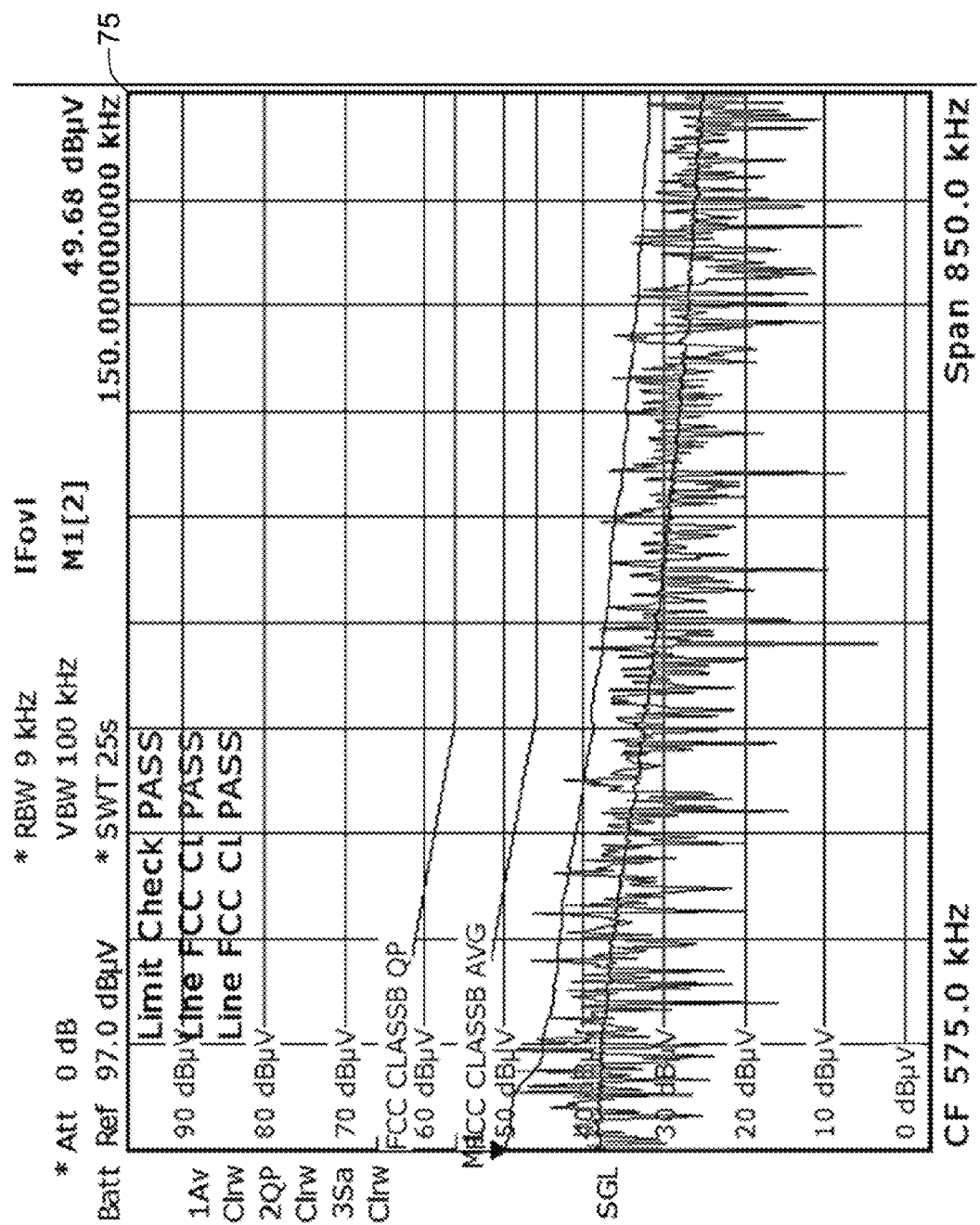
FIG. 6 is a diagram of a graph that may show electromagnetic interference caused by an example of the present circuit.

FIG. 6 is a diagram of a graph 75 that may show test results for an example circuit 10, to determine an amount of EMI noise that could be emitted on the AC main lines so as to determine whether the circuit is compliant with pertinent regulations.

To recap, a silicon controlled rectifier drive circuit for an in-line thermostat may incorporate a first silicon controlled rectifier (SCR) having a cathode connected to a first line, an anode connected to a second line, and a gate connected to a source of a first field effect transistor (FET); a first capacitor having a first end connected to a drain of the first FET and a second end connected to a drain of a second FET; a second SCR having a cathode connected to the second line, an anode connected to the first line, and a gate connected to a source of a third FET; a second capacitor having a first end connected to a drain of the third FET and a second end connected to a drain of a fourth FET; a first diode having an anode connected to the first line and a cathode connected to the source of the first FET; and a second diode having an anode connected to the second line and a cathode connected to the source of the second FET.

The first diode may be a Schottky diode, and the second diode may be a Schottky diode.

The circuit may further incorporate a first transient-voltage suppression diode (TVS) having a first end connected to the source of the first FET and a second end connected to the second line, and a second TVS having a first end connected to the source of the third FET and a second end connected to the first line.

The first, second, third and fourth FETs may be N-channel FETs.

The first, second, third and fourth FETs may be MOSFETs.

The first line may be connectable to an AC power source. An electric load may be connectable between the second line and the AC power source.

A power steal module may be connectable between the second line and the electric load.

The circuit may further incorporate a triggering signal source having a first output connected to a gate of the first FET and a gate of the fourth FET, and having a second output connected to a gate of the second FET and a gate of the third FET.

The first and second outputs of the triggering signal source may provide signals that activate and deactivate all FETs simultaneously for a given period. The signals from the first and second outputs may be with respect to a polarity of the FETs.

A silicon controlled rectifier (SCR) passive drive system may incorporate a first SCR having a cathode connected to an anode of a first diode, an anode connected to a first terminal of a first switch, and having a gate connected to a first terminal of a second switch and a cathode of the first diode; a second SCR having a cathode connected to an anode of a second diode, the first terminal of the first switch, an anode connected to a first terminal of a third switch and the cathode of the first SCR, and having a gate connected to a first terminal of a fourth switch and a cathode of the second diode; a first capacitor having a first end connected to a second terminal of the first switch and a second end connected to a second terminal of the second switch; and a second capacitor having a first end connected to a second terminal of the third switch and a second end connected to a second terminal of the fourth switch. Each switch may have a control terminal.

The system may further incorporate a trigger circuit having a first output connected to the control terminals of the second and third switches and a second output connected to the control terminals of the first and fourth switches. The first output may provide a first trigger signal. The second output may provide a second trigger signal. The first trigger signal and the second trigger signal may be synchronized with respect to polarity. The first, second, third and fourth switches may be field effect transistors (FETs). The first terminals of the FETs may be drains. The second terminals of the FETs may be sources. The control terminals of the FETs may be gates.

The first diode may be a Schottky diode. The second diode may be a Schottky diode.

The system may further incorporate a first transient-voltage suppression diode having a first end connected to the gate of the first SCR and a second end connected to the anode of the first SCR, and a second transient-voltage suppression diode having a first end connected to the gate of the second SCR and a second end connected to the anode of the second SCR.

The cathode of the first SCR may be connected to a first line. The cathode of the second SCR may be connected to one end of a load. A second end of the load may be connected to a second line. The first and second lines may be connectable to an AC power source.

A heating control system may incorporate a passive drive mechanism, and a trigger signal generator connected to the passive drive mechanism. The passive drive mechanism may incorporate a first switch having a first terminal, a second terminal connectable to a load, and a control terminal connected to a first output of the trigger signal generator; a capacitor having a first end connected to the first terminal of the first switch and having a second end; a second switch having a first terminal, a second terminal connected to the second end of the capacitor, and a control terminal connected to the trigger signal generator; an SCR having a first terminal connected to the second terminal of the first switch, a second terminal, and a control terminal connected to the first terminal of the second switch; and a diode having a first terminal connected to the second terminal of the SCR, and a second terminal connected to the first terminal of the second switch.

The second terminal of the SCR may be connectable to a power source. The load may be connectable to the power source.

The system may further incorporate a power steal module connected between the load and the second terminal of the first switch.

The first and second switches may be field effect transistors. The first and second terminals of the first switch may be a drain and a source, respectively. The first and second terminals of the second switch may be a source and a drain, respectively. The first and second terminals of the SCR may an anode and a cathode, respectively. The control terminal of the SCR may be a gate. The first terminal of the diode may be an anode and the second terminal may be a cathode.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A silicon controlled rectifier drive circuit for an in-line thermostat comprising:
   a first silicon controlled rectifier (SCR) having a cathode connected to a first line, an anode connected to a second line, and a gate connected to a source of a first field effect transistor (FET);
   a first capacitor having a first end connected to a drain of the first FET and a second end connected to a drain of a second FET;
   a second SCR having a cathode connected to the second line, an anode connected to the first line, and a gate connected to a source of a third FET;
   a second capacitor having a first end connected to a drain of the third FET and a second end connected to a drain of a fourth FET;
   a first diode having an anode connected to the first line and a cathode connected to the source of the first FET; and
   a second diode having an anode connected to the second line and a cathode connected to the source of the second FET.

2. The circuit of claim 1, wherein:
   the first diode is a Schottky diode; and
   the second diode is a Schottky diode.

3. The circuit of claim 1, further comprising:
   a first transient-voltage suppression diode (TVS) having a first end connected to the source of the first FET and a second end connected to the second line; and
   a second TVS having a first end connected to the source of the third FET and a second end connected to the first line.

4. The circuit of claim 1, wherein the first, second, third and fourth FETs are N-channel FETs.

5. The circuit of claim 1, wherein the first, second, third and fourth FETs are MOSFETs.

6. The circuit of claim 1, wherein:
   the first line is connectable to an AC power source; and
   an electric load is connectable between the second line and the AC power source.

7. The circuit of claim 6, wherein a power steal module is connectable between the second line and the electric load.

8. The circuit of claim 2, further comprising a triggering signal source having a first output connected to a gate of the first FET and a gate of the fourth FET, and having a second output connected to a gate of the second FET and a gate of the third FET.

9. The circuit of claim 8, wherein:
   the first and second outputs of the triggering signal source provide signals that activate and deactivate all FETs simultaneously for a given period; and
   the signals from the first and second outputs are with respect to a polarity of the FETs.

10. A silicon controlled rectifier (SCR) passive drive system comprising:
    a first SCR having a cathode connected to an anode of a first diode, an anode connected to a first terminal of a first switch, and having a gate connected to a first terminal of a second switch and a cathode of the first diode;
    a second SCR having a cathode connected to an anode of a second diode, the first terminal of the first switch, an anode connected to a first terminal of a third switch and the cathode of the first SCR, and having a gate connected to a first terminal of a fourth switch and a cathode of the second diode;
    a first capacitor having a first end connected to a second terminal of the first switch and a second end connected to a second terminal of the second switch; and
    a second capacitor having a first end connected to a second terminal of the third switch and a second end connected to a second terminal of the fourth switch; and
    wherein each switch comprises a control terminal.

11. The system of claim 10, further comprising a trigger circuit having a first output connected to the control terminals of the second and third switches and a second output connected to the control terminals of the first and fourth switches.

12. The system of claim 11, wherein:
    the first output provides a first trigger signal;
    the second output provides a second trigger signal; and
    the first trigger signal and the second trigger signal are synchronized with respect to polarity.

13. The system of claim 12, wherein:
the first, second, third and fourth switches are field effect transistors (FETs);
the first terminals of the FETs are drains;
the second terminals of the FETs are sources; and
the control terminals of the FETs are gates.

14. The system of claim 10, wherein:
the first diode is a Schottky diode; and
the second diode is a Schottky diode.

15. The system of claim 13, further comprising:
a first transient-voltage suppression diode having a first end connected to the gate of the first SCR and a second end connected to the anode of the first SCR; and
a second transient-voltage suppression diode having a first end connected to the gate of the second SCR and a second end connected to the anode of the second SCR.

16. The system of claim 11, wherein:
the cathode of the first SCR is connected to a first line;
the cathode of the second SCR is connected to one end of a load;
a second end of the load is connected to a second line; and
the first and second lines are connectable to an AC power source.

17. A heating control system comprising:
a passive drive mechanism; and
a trigger signal generator connected to the passive drive mechanism; and
wherein:
the passive drive mechanism comprises:
   a first switch having a first terminal, a second terminal connectable to a load, and a control terminal connected to a first output of the trigger signal generator;
   a capacitor having a first end connected to the first terminal of the first switch and having a second end;
   a second switch having a first terminal, a second terminal connected to the second end of the capacitor, and a control terminal connected to the trigger signal generator;
   an SCR having a first terminal connected to the second terminal of the first switch, a second terminal, and a control terminal connected to the first terminal of the second switch; and
   a diode having a first terminal connected to the second terminal of the SCR, and a second terminal connected to the first terminal of the second switch.

18. The system of claim 17, wherein:
the second terminal of the SCR is connectable to a power source; and
the load is connectable to the power source.

19. The system of claim 17, further comprising a power steal module connected between the load and the second terminal of the first switch.

20. The system of claim 17, wherein:
the first and second switches are field effect transistors;
the first and second terminals of the first switch are a drain and a source, respectively;
the first and second terminals of the second switch are a source and a drain, respectively;
the first and second terminals of the SCR are an anode and a cathode, respectively;
the control terminal of the SCR is a gate; and
the first terminal of the diode is an anode and the second terminal is a cathode.

* * * * *